(12) United States Patent
Sun et al.

(10) Patent No.: US 11,437,659 B2
(45) Date of Patent: Sep. 6, 2022

(54) BATTERY MANAGING METHOD AND BATTERY MANAGING APPARATUS

(71) Applicant: Shenzhen Hello Tech Energy Co., Ltd., Shenzhen (CN)

(72) Inventors: Zhongwei Sun, Shenzhen (CN); Xuhe Liu, Shenzhen (CN); Hong Chen, Shenzhen (CN); Wei Bai, Shenzhen (CN); Yanqiu Chu, Shenzhen (CN)

(73) Assignee: SHENZHEN HELLO TECH ENERGY CO., LTD., Shenzhen (CN)

( * ) Notice: Subject to any disclaimer, the term of this patent is extended or adjusted under 35 U.S.C. 154(b) by 299 days.

(21) Appl. No.: 16/724,169

(22) Filed: Dec. 20, 2019

(65) Prior Publication Data

US 2020/0395640 A1    Dec. 17, 2020

(30) Foreign Application Priority Data

Jun. 17, 2019   (CN) .......................... 201910521215.0

(51) Int. Cl.
*H01M 10/48*   (2006.01)
*G01R 31/3842* (2019.01)
*H01M 10/42*   (2006.01)

(52) U.S. Cl.
CPC ...... *H01M 10/482* (2013.01); *G01R 31/3842* (2019.01); *H01M 10/486* (2013.01); *H01M 2010/4271* (2013.01)

(58) Field of Classification Search
CPC .................................................. H01M 10/482
See application file for complete search history.

(56) References Cited

U.S. PATENT DOCUMENTS

| 2003/0087148 | A1* | 5/2003 | Minamiura | ......... | H01M 10/482 |
|  |  |  |  |  | 429/62 |
| 2017/0054134 | A1* | 2/2017 | Choi | ...................... | G01R 31/36 |

FOREIGN PATENT DOCUMENTS

CN          201438493 U  *  4/2010  ............ H01M 10/42

OTHER PUBLICATIONS

Geng. CN 201438493 U. Apr. 14, 2010. English machine translation by EPO. (Year: 2010).*

* cited by examiner

*Primary Examiner* — James Lee

(57) ABSTRACT

The present disclosure discloses a method and apparatus of managing battery. The method includes: obtaining a first and second state parameters; determining whether a first and second batteries meet a predetermined first paralleling condition, if yes, powering on a current-limiting module, powering on the bidirectional DC/DC converter being and delayingly powering off the current-limiting module; obtaining a third and fourth state parameters; determining whether the first and second batteries meet a predetermined second paralleling condition, if yes, powering on the paralleling switch and delayingly powering off the bidirectional DC/DC converter. The present disclosure can output a voltage under relatively safe conditions and achieve power supply safety.

20 Claims, 5 Drawing Sheets

BATTERY MANAGING METHOD AND BATTERY MANAGING APPARATUS

TECHNICAL FIELD

The present disclosure relates to an electronic device, in particular to a method and an apparatus of managing a battery.

BACKGROUND

In the actual use of a battery, the voltage and capacity of the monomer battery often cannot meet the load demand. Therefore, it is often necessary to use a plurality of monomer batteries connected in series and in parallel. However, different monomer batteries have differences in the initial performance state when being in the process of production, due to the limitations of the production process. In addition, different monomer batteries have differences when being in different working.

Therefore, if the plurality of monomer batteries connected in parallel, it is an exigent problem to be solved that how to ensure parallel expansion among the plurality of batteries, to reduce personnel loss and property damage when the batteries are in parallel, due to improper control.

SUMMARY

The present disclosure provides a method and apparatus of managing battery to improve power supply security of a multi-battery power supply system.

The objective of the present disclosure is achieved by the following technical solutions:

A battery managing method used in a battery managing apparatus, the battery managing apparatus communicating with a first battery and a second battery, the battery managing apparatus comprising a switch module, the switch module comprising a current-limiting module, a bidirectional DC/DC converter, and a paralleling switch, the battery managing method comprises:

obtaining a first state parameter of the first battery, the first state parameter is a current running parameter of the first battery;

obtaining a second state parameter of the second battery, the second state parameter is a current running parameter of the second battery;

determining whether the first battery and the second battery meet a predetermined first paralleling condition according to the first state parameter and the second state parameter;

if the first battery and the second battery meet the predetermined first paralleling condition, powering on the current-limiting module, to enable the first battery to be electrically connected to the second battery through the current-limiting module;

powering on the bidirectional DC/DC converter and delayingly powering off the current-limiting module, to enable the first battery to be electrically connected to the second battery through the bidirectional DC/DC converter;

obtaining a third state parameter of the first battery;
obtaining a fourth state parameter of the second battery;
determining whether the first battery and the second battery meet a predetermined second paralleling condition according to the third state parameter and the fourth state parameter; and powering on the paralleling switch and delayingly powering off the bidirectional DC/DC converter if the first battery and the second battery meet the predetermined second paralleling condition;

wherein the third state parameter is a running state between the first and second batteries after the first battery is electrically connected to the second battery through the bidirectional DC/DC converter; the fourth state parameter is a running state between the first and second batteries after the first battery is electrically connected to the second battery through the bidirectional DC/DC converter.

Preferably, the first state parameter comprises a first temperature value, the second state parameter comprises a second temperature value, the step of determining whether the first battery and the second battery meet a predetermined second paralleling condition according to the third state parameter and the fourth state parameter, comprising:

determining whether each of the first temperature value and the second temperature value is less than a temperature threshold; and if each of the first temperature value and the second temperature value is less than the temperature threshold, determining the first battery and the second battery meet the predetermined first paralleling condition.

Preferably, the first state parameter comprising a first electric quantity, the second state parameter comprising a second electric quantity, the step of determining whether the first battery and the second battery meet the predetermined first paralleling condition according to the first state parameter and the second state parameter, comprising:

determining whether each of the first electric quantity and the second electric quantity is greater than the electricity threshold; and if each of the first electric quantity and the second electric quantity is greater than the electricity threshold, determining the first battery and the second battery meet the predetermined first paralleling condition.

Preferably, the first state parameter comprises a first battery type, the second state parameter comprises a second battery type, the step of determining whether the first battery and the second battery meet the predetermined first paralleling condition according to the first state parameter and the second state parameter, comprising:

determining whether both the first battery type and the second battery type are the same; and if both the first battery type and the second battery type are the same, determining the first battery and the second battery meet the predetermined first paralleling condition.

Preferably, the first state parameter comprises a first temperature value, a first electric quantity and a first battery type, the second state parameter comprises a second temperature value, a second electric quantity and a second battery type, the step of determining whether the first battery and the second battery meet the predetermined first paralleling condition according to the first state parameter and the second state parameter, comprising:

determining whether the first battery type and the second battery type are the same;

if the first battery type and the second battery type are the same, determining each of the first temperature value and the second temperature value is less than the temperature threshold;

if each of the first temperature value and the second temperature value is less than the temperature threshold, determining each of the first electric quantity and the second electric quantity is greater than the electricity threshold; and if each of the first electric quantity and the second electric quantity is greater than the electricity threshold, determining the first battery and the second battery meet the predetermined first paralleling condition.

Preferably, the battery managing apparatus further comprising an alarm, the battery managing method comprising:

controlling to trigger off the alarm if the first battery and the second battery do not meet the predetermined first paralleling condition.

Preferably, the step of powering on the paralleling switch and delayingly powering off the bidirectional DC/DC converter, comprising:

powering on the paralleling switch and timing;

determining whether the timing time exceeding a second time threshold; and powering off the bidirectional DC/DC converter if the timing time exceeding a second time threshold.

Preferably, the third state parameter comprising a first voltage value, the fourth state parameter comprises a second voltage value, the step of determining whether the first battery and the second battery meet a predetermined second paralleling condition according to the third state parameter and the fourth state parameter, comprising:

determining whether a difference value between the first voltage and the second voltage is less than a voltage threshold; and if the difference value between the first voltage and the second voltage is less than the voltage threshold, determining the first battery and the second battery meet the predetermined second paralleling condition.

Preferably, the battery managing method further comprising:

obtaining a fifth state parameter of the first battery;

obtaining a sixth state parameter of the second battery; and adjusting to power on/off the switch module according to the fifth state parameter and the sixth state parameter, to adjust the parallelling connection between the first battery and the second battery through the switch module;

the fifth state parameter is configured to indicate a running state between the first and second batteries after the first battery is electrically connected to the second battery in parallel through the paralleling switch; the sixth state parameter is also configured to indicate a running state between the first and second batteries after the first battery is electrically connected to the second battery in parallel through the paralleling switch.

A battery managing apparatus is also provided, the battery managing apparatus comprises a current-limiting module, a bidirectional DC/DC converter, a paralleling switch, a storage configured to store computer-executable battery managing program; and a processor, each of the storage, the current-limiting module, bidirectional DC/DC converter, and the paralleling switch is electrically connected to the processor; the processor is configured to execute the computer-executable battery managing program to execute the battery managing method as described above.

Compared with the prior art, through current-limiting module, the battery managing method and apparatus of the present disclosures can avoid excessive momentary dash current to be generated during electrical connections and generate sparks, which causes damage to the first battery and the second battery; through bidirectional DC/DC converter, the state parameter of first battery and second battery are relatively balanced, the first battery is electrically connected to the second battery in parallel when the battery state meet the predetermined conditions, this ensures that the multi-battery power supply system to output the voltage under relatively safe conditions, achieving power supply safety.

DETAILED DESCRIPTION OF THE PREFERRED EMBODIMENTS

Figure 1A:
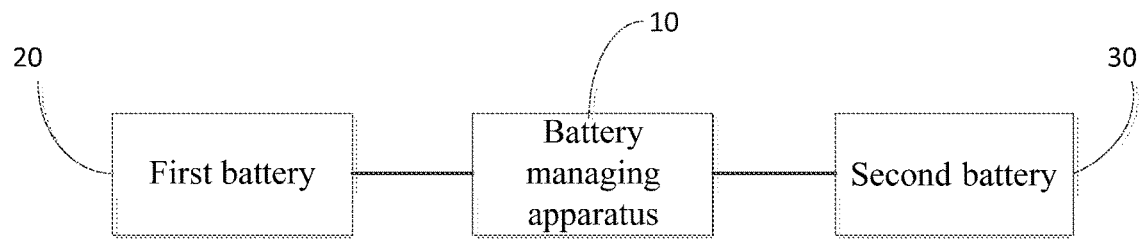
FIG. 1A is a schematic diagram of one exemplary embodiment of a battery managing apparatus, a first battery, and a second battery.

Below, embodiments of the present invention will be described in greater detail with reference to the drawings. It should be noted that the embodiment are illustrative rather than limiting the scope of the present invention.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1A illustrates that a battery managing apparatus 10. The battery managing apparatus 10 comprises one interface or a plurality of interfaces (not shown). The battery managing apparatus 10 is electrically connected to a first battery 20 and a second battery 30 through the interfaces, to output a voltage in parallel between the first battery 20 and second battery 30 through the battery managing apparatus 10.

Figure 1B:
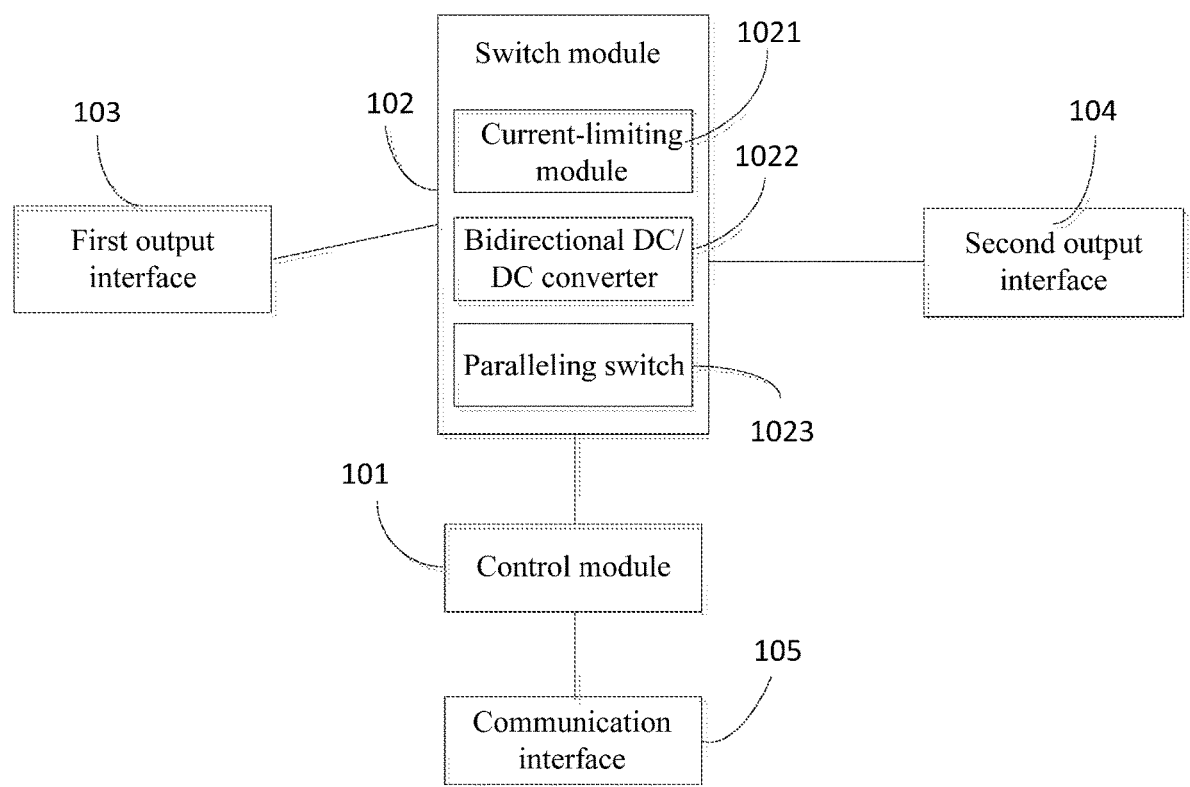
FIG. 1B is a block diagram of the battery managing apparatus of FIG. 1.

Specifically, FIG. 1B illustrates the battery managing apparatus 10 comprises a control module 101, a switch module 102, a first output interface 103, a second output interface 104, and a communication interface 105. The control module 101 is electrically connected to the communication interface 105. The control module 101 is configured to be communicated with the first battery 20 and/or the second battery 30 through the communication interface 105. The first output interface 103 and the second output interface 104 are configured to be engaged with the first battery 20 and the second battery 30, respectively. Both the first output interface 103 and the second output interface 104 are electrically connected to the control module 101, through the switch module 102, thereby enabling to output a voltage in parallel between the first battery 20 and second battery 30.

In at least one exemplary embodiment, the switch module 102 comprises a current-limiting module 1021, a bidirectional direct current/direct current (DC/DC) converter 1022, and a paralleling switch 1023. The current-limiting module 1021 comprises a current-limiting resistance and a current-limiting switch. The first output interface 103 is configured to be connected to the second output interface 104 through the current-limiting module 1021. When the first battery 20 is electrically connected to the second battery 30 in parallel through the first output interface 103 being electrically connected to the second output interface 104 by the current-limiting module 1021, due to the existence of the current-limiting resistance, the current between the first battery 20 and the second battery 30 is less, avoiding excessive momentary dash current to be generated during electrical connections and generate sparks, which causes damage to the first battery 20 and the second battery 30.

The bidirectional DC/DC converter 1022 is configured to realize the positive and negative bidirectional charge and discharge between two parallel power storage devices, such as two batteries, so that the voltage difference between the two power storage devices is less or even zero.

The paralleling switch 1023 is configured to output a voltage in parallel between two powered devices or electrical storage devices.

Figure 2A:
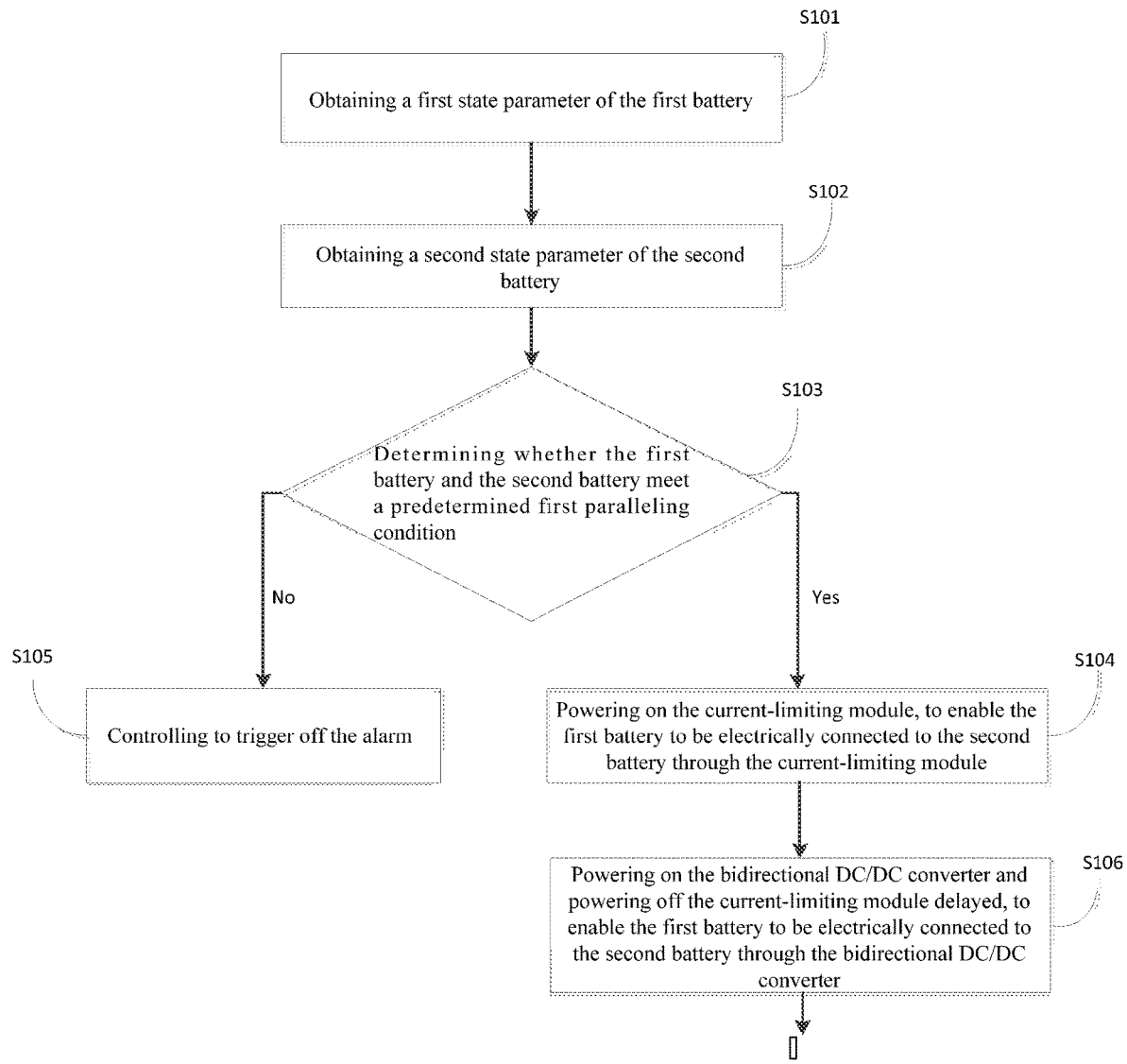
FIG. 2A is a partial flowchart of one exemplary embodiment of a battery managing method.
Figure 2B:
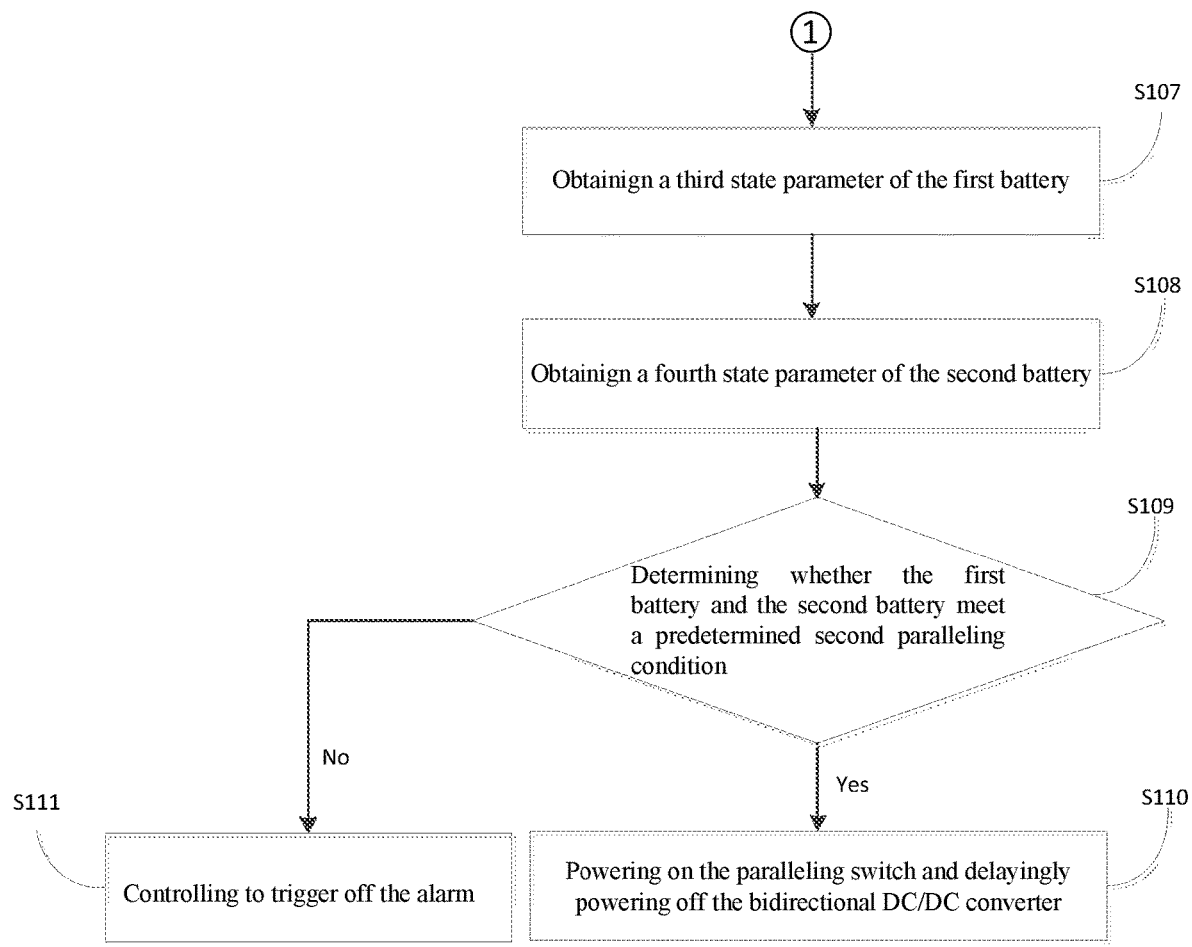
FIG. 2B is another partial flowchart of one exemplary embodiment of the battery managing method.

FIGS. 2A-2B illustrate a flowchart of a method in accordance with a first example embodiment. A battery managing method is provided by way of example, as there are a variety of ways to carry out the method. The battery managing method described below can be carried out using the configurations illustrated in FIGS. 1A-1B, for example, and various elements of these figures are referenced in explaining method of preparing the cathode current collector. The illustrated order of blocks is by example only and the order of the blocks can change. Additional blocks may be added or fewer blocks may be utilized without departing from this disclosure. The battery managing method is configured to be used in the battery managing apparatus 10 and can begin at block S101.

At block S101, obtaining a first state parameter of the first battery 20. In at least one exemplary embodiment, the first state parameter is a current running parameter of the first battery 20.

The first state parameter is configured to indicate a current running state of the first battery 20, such as a parameter SOC and/or a parameter SOH of the first battery 20; in at least one exemplary embodiment, the first state parameter comprises any one or more of a first battery type, a first temperature value and a first electric quantity.

In at least one exemplary embodiment, the step of obtaining the first state parameter of the first battery 20 can be a step of sending the first state parameter to the first battery 20 by the battery managing apparatus 10 to enable the first battery 20 to respond the first state parameter and send the first state parameter the battery managing apparatus 10.

In at least one exemplary embodiment, the step of obtaining the first state parameter of the first battery 20 can be a step of sending the first state parameter to the battery managing apparatus 10 by the first battery 20 in a period of T, a value of T can be set according to actual needs.

At block S102, obtaining a second state parameter of the second battery 30. In at least one exemplary embodiment, the second state parameter is a current running parameter of the second battery 30.

The second state parameter is configured to indicate a current running state of the second battery 30, such as a parameter SOC and/or a parameter SOH of the second battery 30; in at least one exemplary embodiment, the second state parameter comprises any one or more of a second battery type, a second temperature value and a second electric quantity.

In at least one exemplary embodiment, the step of obtaining the second state parameter of the second battery 30 can be a step of sending the second state parameter to the second battery 30 by the battery managing apparatus 10 to enable the second battery 30 to respond the second state parameter and send the second state parameter the battery managing apparatus 10.

In at least one exemplary embodiment, the step of obtaining the second state parameter of the second battery 30 can be a step of sending the second state parameter to the battery managing apparatus 10 by the second battery 30 in a period of T, a value of T can be 10 seconds (s), 20*s* or 30*s*, or set according to actual needs.

At block S103, determining whether the first battery 20 and the second battery 30 meet a predetermined first paralleling condition according to the first state parameter and the second state parameter. If yes, the method goes to block S104; if no, the method goes to block S105.

In at least one exemplary embodiment, the first state parameter comprises a first temperature value, the second state parameter comprises a second temperature value, the step of determining whether the first battery 20 and the second battery 30 meet the predetermined first paralleling condition according to the first state parameter and the second state parameter, comprises:

determining whether each of the first temperature value and the second temperature value is less than a temperature threshold; and if each of the first temperature value and the second temperature value is less than the temperature threshold, determining the first battery and the second battery meet the predetermined first paralleling condition.

Predetermine a temperature threshold, if both a first temperature value of the first battery 20 and a second temperature value of the second battery 30 are less than the temperature threshold, determine the first battery 20 and the second battery 30 meet the predetermined first paralleling condition, perform preliminary limiting current in parallel through the current-limiting module 1021.

In at least one exemplary embodiment, the battery managing apparatus 10 comprises a display. If one the first temperature value of the first battery 20 and the second temperature value of the second battery 30 is greater than or equal to the temperature threshold, determine a state of the first battery 20 or a state of the second battery 30 is unstable, thus determine the first battery and the second battery do not meet the predetermined first paralleling condition, the battery managing apparatus 10 generates warning information and displays the warning information through the display. In at least one exemplary embodiment, the warning information comprises an alert reason, an operator can make judgments and process in time through the warning information.

In at least one exemplary embodiment, the first state parameter comprises a first electric quantity, the second state parameter comprises a second electric quantity, the step of determining whether the first battery 20 and the second battery 30 meet the predetermined first paralleling condition according to the first state parameter and the second state parameter, comprises:

determining whether each of the first electric quantity and the second electric quantity is greater than the electricity threshold;

if each of the first electric quantity and the second electric quantity is greater than the electricity threshold, determining the first battery 20 and the second battery 30 meet the predetermined first paralleling condition.

Predetermine an electricity threshold, if both the first electric quantity of the first battery 20 and the second electric quantity of the second battery 30 are greater than the electricity threshold, determine the first battery and the second battery meet the predetermined first paralleling condition, perform preliminary limiting current in parallel through the current-limiting module 1021.

In at least one exemplary embodiment, the first state parameter comprises a first battery type, the second state parameter comprises a second battery type, the step of determining whether the first battery 20 and the second battery 30 meet the predetermined first paralleling condition according to the first state parameter and the second state parameter, comprises:

determining whether both the first battery type and the second battery type are the same;

if both the first battery type and the second battery type are the same, determining the first battery and the second battery meet the predetermined first paralleling condition.

If two batteries with two different battery types are connected in parallel, there may be different parameters such as battery capacity, battery discharge current, and battery charging current between the two batteries, and if the two batteries are connected in parallel, one of the two batteries may be or both are damaged.

In at least one exemplary embodiment, the first state parameter comprises a first temperature value, a first electric quantity, and a first battery type; the second state parameter comprises a second temperature value, a second electric quantity, and a second battery type; the step of determining whether the first battery 20 and the second battery 30 meet the predetermined first paralleling condition according to the first state parameter and the second state parameter, comprises:

determining whether the first battery type and the second battery type are the same;

if the first battery type and the second battery type are the same, determining each of the first temperature value and the second temperature value is less than the temperature threshold;

if each of the first temperature value and the second temperature value is less than the temperature threshold, determining each of the first electric quantity and the second electric quantity is greater than the electricity threshold;

if each of the first electric quantity and the second electric quantity is greater than the electricity threshold, determining the first battery 20 and the second battery 30 meet the predetermined first paralleling condition.

At block S104, powering on the current-limiting module 1021, to enable the first battery 20 to be electrically connected to the second battery 30 through the current-limiting module 1021.

If the first battery 20 and the second battery 30 meet the first paralleling condition, control a switch of the current-limiting module 1021 to be turned off, to enable the first output interface 103 to be electrically connected to the second output interface 104 through the current-limiting module 1021, to enable the first battery 20 to be electrically connected to the second battery 30 through the current-limiting module 1021, thereby avoiding losses caused by a momentary dash current when the first battery 20 is electrically connected to the second battery 30.

At block S105, controlling to trigger off the alarm.

The battery managing apparatus 10 further comprises an alarm. In at least one exemplary embodiment, the alarm can be a buzzer or a LED light. If the first battery 20 and the second battery 30 do not meet the predetermined first paralleling condition, the buzzer can be controlled to triggered off or the LED light can be controlled to be lit or flashing.

In at least one exemplary embodiment, the block S105 can be an ending step.

At block S106, powering on the bidirectional DC/DC converter 1022 and powering off the current-limiting module delayingly, to enable the first battery 20 to be electrically connected to the second battery 30 through the bidirectional DC/DC converter 1022.

When the first battery 20 is electrically connected to the second battery 30 in parallel through the current-limiting module 1021, the bidirectional DC/DC converter 1022 is powered on, the current-limiting module 1021 is delayingly powered on, so that if there is a large voltage difference between the first battery 20 and the second battery 30, the high voltage battery with a high voltage can charge the battery with a low voltage battery, thereby enabling the voltage difference between the first battery 20 and the second battery 30 is less than the predetermined threshold, thus a voltage can be output through parallelling connections between the first battery 20 and the second battery 30.

Figure 3:
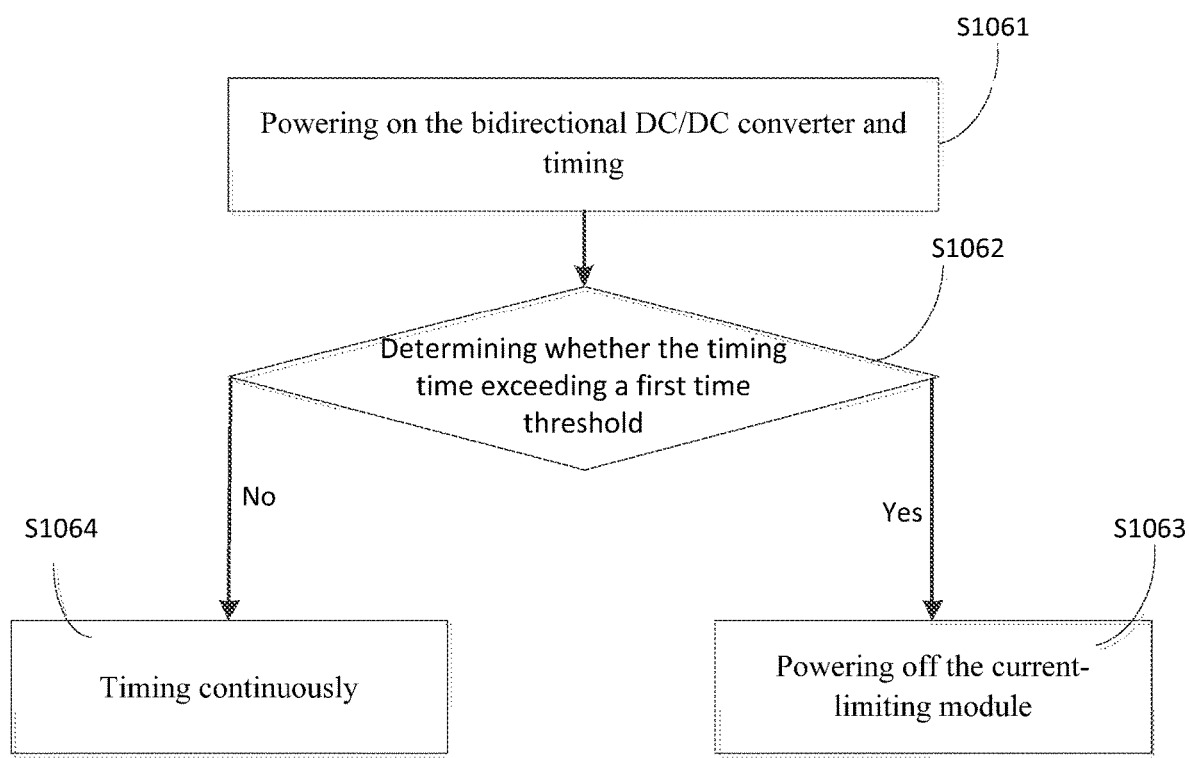
FIG. 3 is a flowchart of one exemplary embodiment of block 106 of the battery managing method of FIG. 2A.

In at least one exemplary embodiment, FIG. 3 illustrates a method of the block S106, the method of the block S106 begins at block S1061.

At block S1061, powering on the bidirectional DC/DC converter 1022 and timing.

At block S1062, determining whether the timing time exceeds a first time threshold.

At block S1063, powering off the current-limiting module if the timing time exceeding the first time threshold.

In at least one exemplary embodiment, predetermine the first time threshold, when the bidirectional DC/DC converter 1022 is powered on and time, if the timing time T exceeds the predetermined first time threshold, determine the bidirectional DC/DC converter 1022 working stably and the current-limiting module 1021 is powered off.

At block S1064, timing continuously if the timing time not exceeding the first time threshold.

At block S107, obtaining a third state parameter of the first battery 20; in at least one exemplary embodiment, the third state parameter is a running state between the first and second batteries after the first battery 20 is electrically connected to the second battery 30 through the bidirectional DC/DC converter 1022.

The third state parameter is configured to indicate a running parameter t between the first and second batteries after the first battery 20 is electrically connected to the second battery 30 through the bidirectional DC/DC converter 1022, for example, the running parameter can be SOC and/or the parameter SOH between the first and second batteries after the first battery 20 is electrically connected to the second battery 30 through the bidirectional DC/DC converter 1022, and the third state parameter comprises any one or more of a first voltage value or a first current of the first battery 20.

In one exemplary embodiment, the step of obtaining the third state parameter of the first battery 20 can be sending a request of the third state parameter to the first battery 20 by the battery managing apparatus 10, to enable the first battery 20 to respond the third state parameter to send the third state parameter to the battery managing apparatus 10.

In another one exemplary embodiment, the step of obtaining the third state parameter of the first battery 20 can also be sending the third state parameter to the battery managing apparatus 10 in a period of T by the first battery 20, a value of T can be set according to actual needs.

At block S108, obtaining a fourth state parameter of the second battery 30; in at least one exemplary embodiment, the fourth state parameter is a running state between the first and second batteries after the first battery 20 is electrically connected to the second battery 30 through the bidirectional DC/DC converter 1022.

The fourth state parameter is configured to indicate a running parameter t between the first and second batteries after the first battery 20 is electrically connected to the second battery 30 through the bidirectional DC/DC converter 1022, for example, the running parameter can be SOC and/or the parameter SOH between the first and second batteries after the first battery 20 is electrically connected to the second battery 30 through the bidirectional DC/DC converter 1022, and the third state parameter comprises any one or more of a first voltage value or a first current of the first battery 20.

In one exemplary embodiment, the step of obtaining the fourth state parameter of the second battery 30 can be sending a request of the fourth state parameter to the second battery 30 by the battery managing apparatus 10, to enable the second battery 30 to respond the fourth state parameter to send the third state parameter to the battery managing apparatus 10.

In another one exemplary embodiment, the step of obtaining the fourth state parameter of the second battery 30 can also be sending the fourth state parameter to the battery managing apparatus 10 in a period of T by the second battery 30, a value of T can be set according to actual needs.

At block S109, determining whether the first battery and the second battery meet a predetermined second paralleling condition according to the third state parameter and the fourth state parameter.

In at least one exemplary embodiment, the third state parameter comprises a first voltage value, the fourth state parameter comprises a second voltage value, the step of determining whether the first battery and the second battery meet a predetermined second paralleling condition according to the third state parameter and the fourth state parameter, comprises:

determining whether a difference value between the first voltage and the second voltage is less than a voltage threshold;

if the difference value between the first voltage and the second voltage is less than the voltage threshold, determining the first battery 20 and the second battery 30 meet the predetermined second paralleling condition, and the method goes to block S110; if no, the method goes to block S111.

At block S110, powering on the paralleling switch 1023 and delayingly powering off the bidirectional DC/DC converter 1022, to enable output a voltage when the first battery 20 is electrically connected to the second battery 30 in parallel through the paralleling switch 1023.

Figure 4:
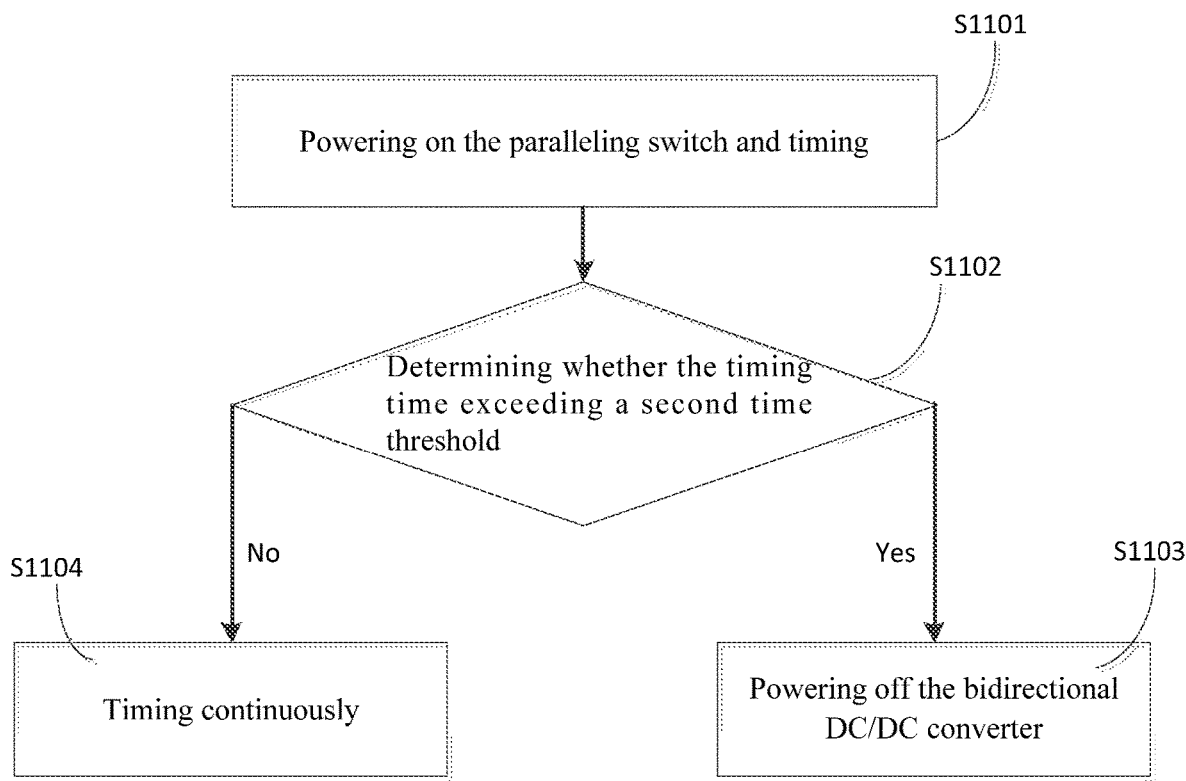
FIG. 4 is a flowchart of one exemplary embodiment of block 110 of the battery managing method of FIG. 2B.

In at least one exemplary embodiment, FIG. 4 illustrates a method of the block S110, the method of the block S106 begins at block S1101.

At block S1101, powering on the paralleling switch 1023 and timing;

At block S1102, determining whether the timing time exceeding a second time threshold. If yes, the method goes to block S1103; if no, the method goes to block S1104.

At block S1103, powering off the bidirectional DC/DC converter 1022.

At block S1104, timing continuously.

In at least one exemplary embodiment, predetermine the second time threshold, when the paralleling switch 1023 is powered on and time, if the timing time T exceeds the second predetermined time threshold, determine the paralleling switch 1023 works stably, and the bidirectional DC/DC converter 1022 is powered off.

At block S111, controlling to trigger off the alarm.

In at least one exemplary embodiment, the block S111 and the block S105 are the same.

In at least one exemplary embodiment, the battery managing method further comprises:

obtaining a fifth state parameter of the first battery; in at least one exemplary embodiment, the fifth state parameter is configured to indicate a running state between the first and second batteries after the first battery is electrically connected to the second battery in parallel through the paralleling switch;

obtaining a sixth state parameter of the second battery; in at least one exemplary embodiment, the sixth state parameter is also configured to indicate a running state between the first and second batteries after the first battery is electrically connected to the second battery in parallel through the paralleling switch;

adjusting to power on/off the switch module according to the fifth state parameter and the sixth state parameter, to adjust the parallelling connection between the first battery and the second battery through the switch module.

In at least one exemplary embodiment, the fifth state parameter comprises any one or more of a third voltage, a third current or a third temperature, the sixth state parameter comprises any one or more of a fourth voltage, a fourth current or a fourth temperature.

If one of the third and fourth voltage is less than the predetermined voltage threshold, and one of the third and fourth current is less than one of the predetermined current/ or one of the third and fourth temperature is greater than the predetermined temperature threshold, the switch module 102 is powered off, to avoid the influence of the failure of the first battery 20 or the second battery 30 on the parallel connection between each other.

Figure 5:
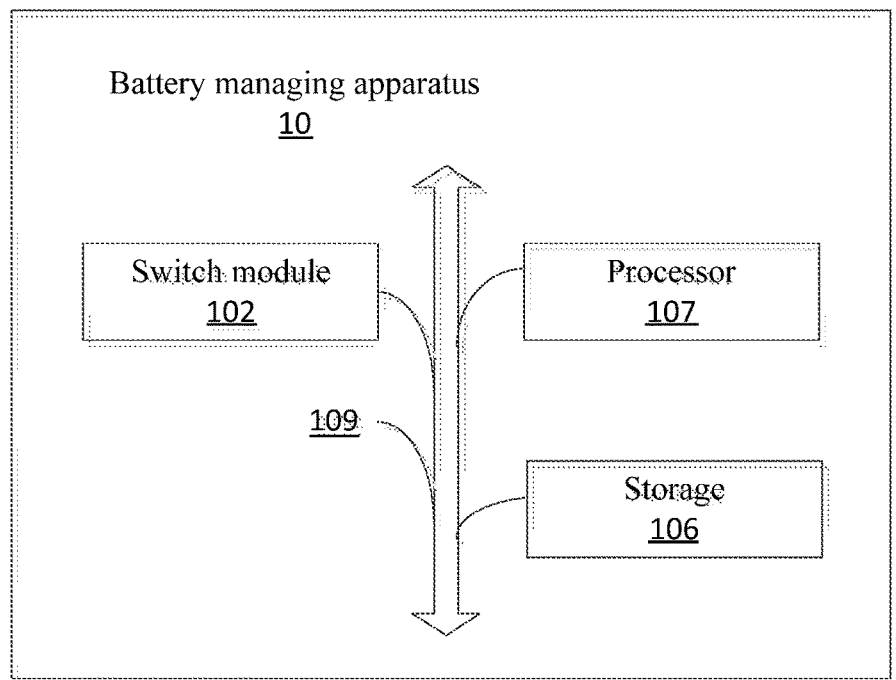
FIG. 5 is a block diagram of the battery managing apparatus.

In at least one exemplary embodiment, FIGS. 1B and 5 illustrate that the battery managing apparatus 10 further comprises a storage 106, a processor 107, and a bus 109, each of the storage 106, the current-limiting module 1021, the bidirectional DC/DC converter 1022, and the paralleling switch 1023 is electrically connected to the processor 107 through the bus 109.

The storage 106 comprises readable storage medium, readable storage medium comprises a flash memory, a hard disk, a multimedia card, a card type memory (exemplary, a SD or a DX memory, etc.), a magnetic memory, a disk, a CD, etc. The storage 106 also comprises the at least one a non-volatile computer-readable storage medium and stores operating system, database, and computer-readable instruction. In at least one exemplary embodiment, the storage 106 can be an internal storage unit of the battery managing apparatus 10, such as a hard disk of the battery managing apparatus 10. In other exemplary embodiments, the storage 106 can be an external storage device of the battery managing apparatus 10, such as a plug-in hard drive of the battery managing apparatus 10, a smart media card (SMC), a secure digital (SD), or a flash card. The storage 106 is further configured to stores application software and database stored in the battery managing apparatus 10, such computer-readable codes (for example, battery managing instructions), thus the storage 106 can be storage medium.

In at least one exemplary embodiment, the processor 107 can be a central processing unit (CPU), a controller, a microcontroller, a microprocessor or another data processing chip, through executing the computer-readable instructions or/the data of the database stored in the storage 106, the processor 107 is configured to execute the battery managing method describe.

The above embodiments are only the preferred embodiments of the present invention, and do not limit the scope of the present invention. A person skilled in the art may make various other corresponding changes and deformations based on the described technical solutions and concepts. And all such changes and deformations shall also fall within the scope of the present invention.

What is claimed is:

1. A battery managing method used in a battery managing apparatus, the battery managing apparatus communicating with a first battery and a second battery, the battery managing apparatus comprising a switch module, the switch module comprising a current limiter, a bidirectional DC/DC converter, and a parallel-connection switch, the battery managing method comprising:
    obtaining a first state parameter of the first battery, the first state parameter being a current running parameter of the first battery, and a second state parameter of the second battery, the second state parameter being a current running parameter of the second battery;
    determining whether the first battery and the second battery meet a predetermined first parallel-connection condition based on the first state parameter and the second state parameter;
    in response to determining that the first battery and the second battery meet the predetermined first parallel-connection condition, powering on the current limiter, to enable the first battery to be electrically connected to the second battery through the current limiter;
    powering on the bidirectional DC/DC converter and powering off the current limiter after a certain delay, to enable the first battery to be electrically connected to the second battery through the bidirectional DC/DC converter;
    obtaining a third state parameter of the first battery, and a fourth state parameter of the second battery, the third state parameter being a running state of the first battery after the first battery is electrically connected to the second battery through the bidirectional DC/DC converter, the fourth state parameter being a running state of the second battery after the second battery is electrically connected to the first battery through the bidirectional DC/DC converter;
    determining whether the first battery and the second battery meet a predetermined second parallel-connection condition based on the third state parameter and the fourth state parameter;
    and in response to determining that the first battery and the second battery meet the predetermined second parallel-connection condition, turning on the parallel-connection switch, and powering off the bidirectional DC/DC converter after a certain delay, so that the first battery is electrically connected to the second battery through the parallel-connection switch, and the first battery and the second battery are operative to jointly output a voltage.

2. The battery managing method according to claim 1, wherein the first state parameter comprises a first temperature value, the second state parameter comprises a second temperature value, wherein the step of determining whether the first battery and the second battery meet a predetermined first parallel-connection condition based on the first state parameter and the second state parameter comprises:
    determining whether each of the first temperature value and the second temperature value is less than a temperature threshold; and
    in response to determining that each of the first temperature value and the second temperature value is less than the temperature threshold, determining the first battery and the second battery meet the predetermined first parallel-connection condition.

3. The battery managing method according to claim 2, wherein the battery managing apparatus further comprising an alarm, the battery managing method comprising:
    in response to determining that the first battery and the second battery do not meet the predetermined first parallel-connection condition, controlling to trigger off the alarm noticeable by a human sense.

4. The battery managing method according to claim 3, wherein the alarm comprises at least one selected from the group consisting of a buzzer and a LED light.

5. The battery managing method according to claim 2, wherein the step of turning on the parallel-connection switch and powering off the bidirectional DC/DC converter after a certain delay comprises:
    turning on the parallel-connection switch and starting a timer;
    determining whether a lapsed duration exceeds a second tune threshold; and
    powering off the bidirectional DC/DC converter in response to the lapsed duration exceeding the second time threshold.

6. The battery managing method according to claim 2, Wherein the third state parameter comprising a first voltage value, the fourth state parameter comprises a second voltage value, the step of determining whether the first battery and the second battery meet a predetermined second parallel-connection condition based on the third state parameter and the fourth state parameter comprises:
    determining whether a difference value between the first voltage and the second voltage is less than a voltage threshold; and
    in response to the difference value between the first voltage and the second voltage being less than the voltage threshold, determining the first battery and the second battery meet the predetermined second parallel-connection condition.

7. The battery managing method according to claim 2, further comprising:
    obtaining a fifth state parameter of the first battery, and a sixth state parameter of the second battery, the fifth state parameter indicative of a running state of the first battery after the first battery is electrically connected to the second battery in parallel through the parallel-connection switch, the sixth state parameter indicative of a running state of the second battery after the first battery is electrically connected to the second battery in parallel through the parallel-connection switch; and
    adaptively powering on or oft the switch module depending on the fifth state parameter and the sixth state parameter, to adjust the parallel connection between the first battery and the second battery through the switch module.

8. The battery managing method according to claim 1, wherein the first state parameter comprising a first state of charge, the second state parameter comprising a second state of charge, the step of determining whether the first battery and the second battery meet the predetermined first parallel-connection condition based on the first state parameter and the second state parameter, comprises:
   determining whether each of the first state of charge and the second state of charge is greater than a charge threshold; and
   in response to determining that each of the first state of charge and the second state of charge is greater than charge threshold, determining the first battery and the second battery meet the predetermined first parallel-connection condition.

9. The battery managing method according to claim 8, wherein the battery managing apparatus further comprising an alarm, the battery managing method comprising: in response to determining that the first battery and the second battery do not meet the predetermined first parallel-connection condition, controlling to trigger off the alarm noticeable by a human sense.

10. The battery managing method according to claim 8, wherein the step of turning on the parallel-connection switch and powering off the bidirectional DC/DC converter after a certain delay comprises:
   turning on the parallel-connection switch and starting a timer;
   determining whether a lapsed duration exceeds a second time threshold; and
   powering off the bidirectional DC/DC converter in response to the lapsed duration exceeding the second time threshold.

11. The battery managing method according to claim 8, wherein the third state parameter comprising a first voltage value, the fourth state parameter comprises a second voltage value, the step of determining whether the first battery and the second battery meet a predetermined second parallel-connection condition based on the third state parameter and the fourth state parameter comprises:
   determining whether a difference value between the first voltage and the second voltage is less than a voltage threshold; and
   in response to the difference value between the first voltage and the second voltage being less than the voltage threshold, determining the first battery and the second battery meet the predetermined second parallel-connection condition.

12. The battery managing method according to claim 8, further comprising:
   obtaining a fifth state parameter of the first battery, and a sixth state parameter of the second battery, the fifth state parameter indicative of a running state of the first battery after the first battery is electrically connected to the second battery in parallel through the parallel-connection switch, the sixth state parameter indicative of a running state of the second battery after the first battery is electrically connected to the second battery in parallel through the parallel-connection switch; and
   adaptively powering on or off the switch module depending on the fifth state parameter and the sixth state parameter, to adjust the parallel connection between the first battery and the second battery through the switch module.

13. The battery managing method according to claim 1, wherein the first state parameter comprises a first battery type, the second state parameter comprises a second battery type, the step of determining whether the first battery and the second battery meet the predetermined first parallel-connection condition based on the first state parameter and the second state parameter comprises:
   determining whether both the first battery type and the second battery type are identical; and
   in response to determining that both the first battery type and the second battery type are identical, determining; that the first battery and the second battery meet the predetermined first parallel-connection condition.

14. The battery managing method according to claim 1, wherein the first state parameter comprises a first temperature value, a first state of charge, and a first battery type, the second state parameter comprises a second temperature value, a second state of charge, and a second battery type, wherein the step of determining whether the first battery and the second battery meet the predetermined first parallel-connection condition based on the first state parameter and the second state parameter comprises:
   determining whether the first battery type and the second battery type are identical;
   in response to determining that the first battery type and the second battery type are identical, determining whether each of the first temperature value and the second temperature value is less than a temperature threshold;
   in response to determining that each of the first temperature value and the second temperature value is less than the temperature threshold, determining whether each of the first state of charge and the second state of charge is greater than the charge threshold; and
   in response to determining that each of the first state of charge and the second state of charge is greater than a charge threshold, determining that the first battery and the second battery meet the predetermined first parallel-connection condition.

15. The battery managing method according to claim 14, wherein the step of turning on the parallel-connection switch and powering off the bidirectional DC/DC converter after a certain delay comprises:
   turning on the parallel-connection switch and starting a timer;
   determining whether a lapsed duration exceeds a second time threshold; and
   powering off the bidirectional DC/DC converter in response to the lapsed duration exceeding the second time threshold.

16. The battery managing method according to claim 14, wherein the third state parameter comprises a first voltage value, the fourth state parameter comprises a second voltage value, the step of determining whether the first battery and the second battery meet a predetermined second parallel-connection condition based on the third state parameter and the fourth state parameter comprises:
   determining whether a difference value between the first voltage and the second voltage is less than a voltage threshold; and
   in response to the difference value between the first voltage and the second voltage being less than the voltage threshold, determining the first battery and the second battery meet the predetermined second parallel-connection condition.

17. The battery managing method according to claim 14, further comprising:
- obtaining a fifth state parameter of the first battery, and a sixth state parameter of the second battery, the fifth state parameter indicative of a running state of the first battery after the first battery is electrically connected to the second battery in parallel through the parallel-connection switch, the sixth state parameter indicative of a running state of the second battery after the first battery is electrically connected to the second battery in parallel through the parallel-connection switch; and
- adaptively powering on or off the switch module depending on the fifth state parameter and the sixth state parameter, to adjust the parallel connection between the first battery and the second battery through the switch module.

18. A battery managing apparatus comprising:
- a current limiter;
- a bidirectional DC/DC converter;
- a parallel-connection switch;
- a non-transitory computer-readable storage medium configured to store computer-executable battery managing program; and
- a processor;
- wherein each of the non-transitory computer-readable storage medium, the current limiter, bidirectional DC/DC converter, and the parallel-connection switch is electrically connected to the processor; the processor is configured to execute the computer-executable battery managing program to execute the battery managing method of claim 1.

19. The battery managing apparatus according to claim 18, wherein the first state parameter comprises a first temperature value, the second state parameter comprises a second temperature value, wherein the step of determining whether the first battery and the second battery meet a predetermined first parallel-connection condition based on the first state parameter and the second state parameter comprises:
- determining whether each of the first temperature value and the second temperature value is less than a temperature threshold; and
- in response to determining that each of the first temperature value and the second temperature value is less than the temperature threshold, determining the first battery and the second battery meet the predetermined first parallel-connection condition.

20. The battery managing apparatus according to claim 19, further comprising a display configured to generate and display a warning message in response to determining that the first battery and the second battery do not meet the predetermined first parallel-connection condition.

* * * * *